US012631358B2

(12) United States Patent
Nakano et al.

(10) Patent No.: US 12,631,358 B2
(45) Date of Patent: May 19, 2026

(54) INTERFACE MODULE HAVING FAN FILTER UNIT

(71) Applicant: ASM IP Holding, B.V., Almere (NL)

(72) Inventors: Masashi Nakano, Tama (JP); Masaei Suwada, Nagaoka (JP)

(73) Assignee: ASM IP Holding B.V., Almere (NL)

( * ) Notice: Subject to any disclaimer, the term of this patent is extended or adjusted under 35 U.S.C. 154(b) by 492 days.

(21) Appl. No.: 18/302,110

(22) Filed: Apr. 18, 2023

(65) Prior Publication Data

US 2023/0332791 A1     Oct. 19, 2023

Related U.S. Application Data

(60) Provisional application No. 63/332,647, filed on Apr. 19, 2022.

(51) Int. Cl.
*F24F 11/50*          (2018.01)
*F24F 11/00*          (2018.01)
*H10P 72/00*          (2026.01)

(52) U.S. Cl.
CPC .......... *F24F 11/50* (2018.01); *F24F 11/0001* (2013.01); *H10P 72/0402* (2026.01)

(58) Field of Classification Search
CPC .. F24F 11/50; F24F 11/0001; H01L 21/67017

USPC .......................................................... 454/187
See application file for complete search history.

(56) References Cited

U.S. PATENT DOCUMENTS

| | | | | |
|---|---|---|---|---|
| 5,514,196 A * | 5/1996 | Tanahashi | ......... | H01L 21/67005 |
| | | | | 55/330 |
| 6,224,679 B1 * | 5/2001 | Sasaki | ............... | H01L 21/67017 |
| | | | | 156/345.31 |
| 6,582,296 B2 * | 6/2003 | Komiyama | ............. | F24F 3/167 |
| | | | | 414/935 |
| 9,272,315 B2 | 3/2016 | Chou | | |
| 10,550,468 B2 * | 2/2020 | Nakada | ............. | H01L 21/02164 |
| 10,658,217 B2 * | 5/2020 | Kawai | ............... | H01L 21/67253 |
| 11,749,537 B2 * | 9/2023 | Pannese | ............ | H01L 21/67393 |
| | | | | 95/273 |
| 2020/0135521 A1 * | 4/2020 | Reuter | ............. | H01L 21/67393 |

* cited by examiner

*Primary Examiner* — Steven B McAllister
*Assistant Examiner* — Dana K Tighe
(74) *Attorney, Agent, or Firm* — Banner & Witcoff, Ltd.

(57)          ABSTRACT

Examples of an interface module include a fan filter unit including a fan and a filter, a housing surrounding a space adjacent to the filter, a discharge system attached to the housing, a substrate support instrument provided in the housing, an upper housing surrounding a space adjacent to the fan, a gas supply system attached to the upper housing, a circulation duct connected to the housing and the upper housing, and a radiator provided between the fan and the filter.

18 Claims, 6 Drawing Sheets

FIG. 6

INTERFACE MODULE HAVING FAN FILTER UNIT

FIELD

Examples are described which relate to an interface module having a fan filter unit.

BACKGROUND

An interface module includes a substrate transport apparatus for transferring a substrate. For example, filling the interior of the interface module with $N_2$ gas to reduce oxygen ($O_2$ and $H_2O$) concentration avoids or suppresses a formation of a natural oxide film on the substrate to be transported. According to an example, when the oxygen concentration is 100 ppm or less, it is possible to suppress the natural oxide film from being formed on the substrate. The interface module described above is referred to as $N_2$-Equipment Front End Module (N2-EFEM).

For example, when a substrate at 200° C. or higher is conveyed or stored in an interface module, temperature inside the interface module increases in some cases.

SUMMARY

Some examples described herein may address the above-described problems. Some examples described herein may provide an interface module that can reduce temperature increase.

In some examples, an interface module includes a fan filter unit including a fan and a filter, a housing surrounding a space adjacent to the filter, a discharge system attached to the housing, a substrate support instrument provided in the housing, an upper housing surrounding a space adjacent to the fan, a gas supply system attached to the upper housing, a circulation duct connected to the housing and the upper housing, and a radiator provided between the fan and the filter.

BRIEF DESCRIPTION OF THE DRAWINGS

FIG. 6 is a diagram illustrating an exemplary configuration of a semiconductor manufacturing device including an interface module.

DETAILED DESCRIPTION

Figure 1:
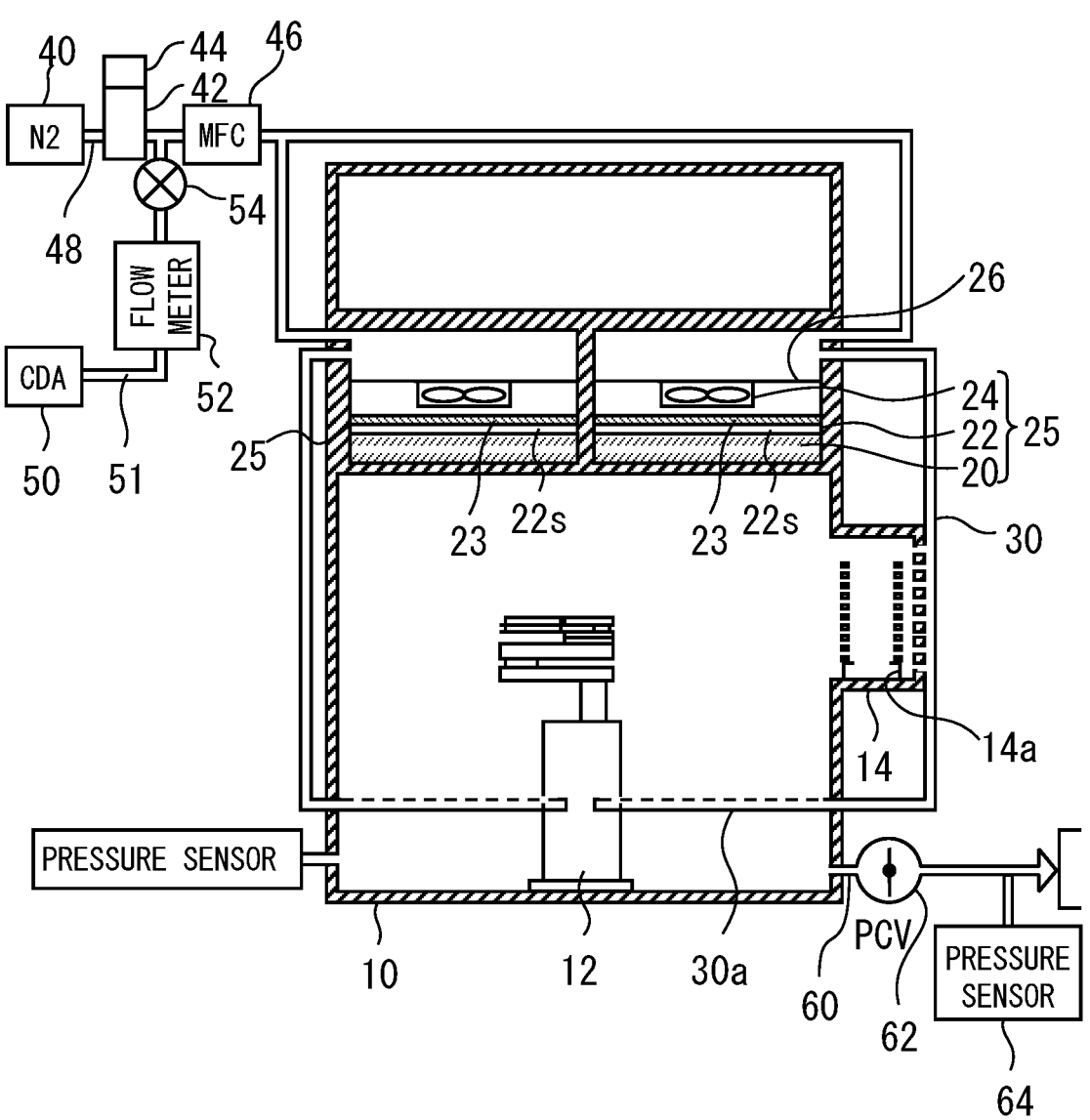
FIG. 1 is a cross-sectional view that illustrates a configuration example of an interface module.

An interface module according to some examples will be described with reference to the accompanying drawings. The same or corresponding components will be assigned the same reference numerals and duplicate description may be omitted.

FIG. 1 is a schematic diagram of an interface module according to one example. The interface module may be provided as a N2-EFEM. The interface module includes a housing 10. In one example, a robotic arm 12 is provided in the housing 10 for transferring the substrate. According to another example, one or more transferring means are provided in the housing 10. In one example, the substrate is a wafer before or after processing.

In an example, the housing 10 includes a part in which the robotic arm 12 is stored and a side chamber 14. In an example illustrated in FIG. 1, the side chamber 14 is positioned beside the part in which the robotic arm 12 is stored. As is apparent from FIG. 1, a space in which the robotic arm 12 is stored and a space of the side chamber 14 are connected to each other. The side chamber 14 is provided with a substrate support instrument 14a for temporarily storing a plurality of substrates. In the example, the substrate support instrument 14a stores a plurality of substrates placed one over another at intervals of several millimeters. The substrate support instrument 14a supports three or four outer edge parts of each substrate. Such a substrate support instrument 14a is also called a cooling stage. In this example, the side chamber 14 is positioned not directly below a fan filter unit 25. In another example, no side chamber 14 may be provided and the substrate support instrument may be provided directly below or not directly below the fan filter unit 25 in the housing 10.

The interface module includes at least one fan filter unit (FFU) 25. FIG. 1 illustrates a configuration in which two FFUs 25 are provided, but one or three or more FFUs 25 may be provided. In an example, each FFU 25 includes a FFU housing 22, a fan 24, and a filter 20. A space between the fan 24 and the filter 20 in the FFU 25 is a fan-filter space 22s. A radiator 23 is provided in the fan-filter space 22s. In other words, the radiator 23 is provided between the fan 24 and the filter 20. In this example, the fan 24, the radiator 23, and the filter 20 are stored in the FFU housing 22. In an example, the radiator 23 directly contacts neither the fan 24 nor the filter 20.

Figure 2:
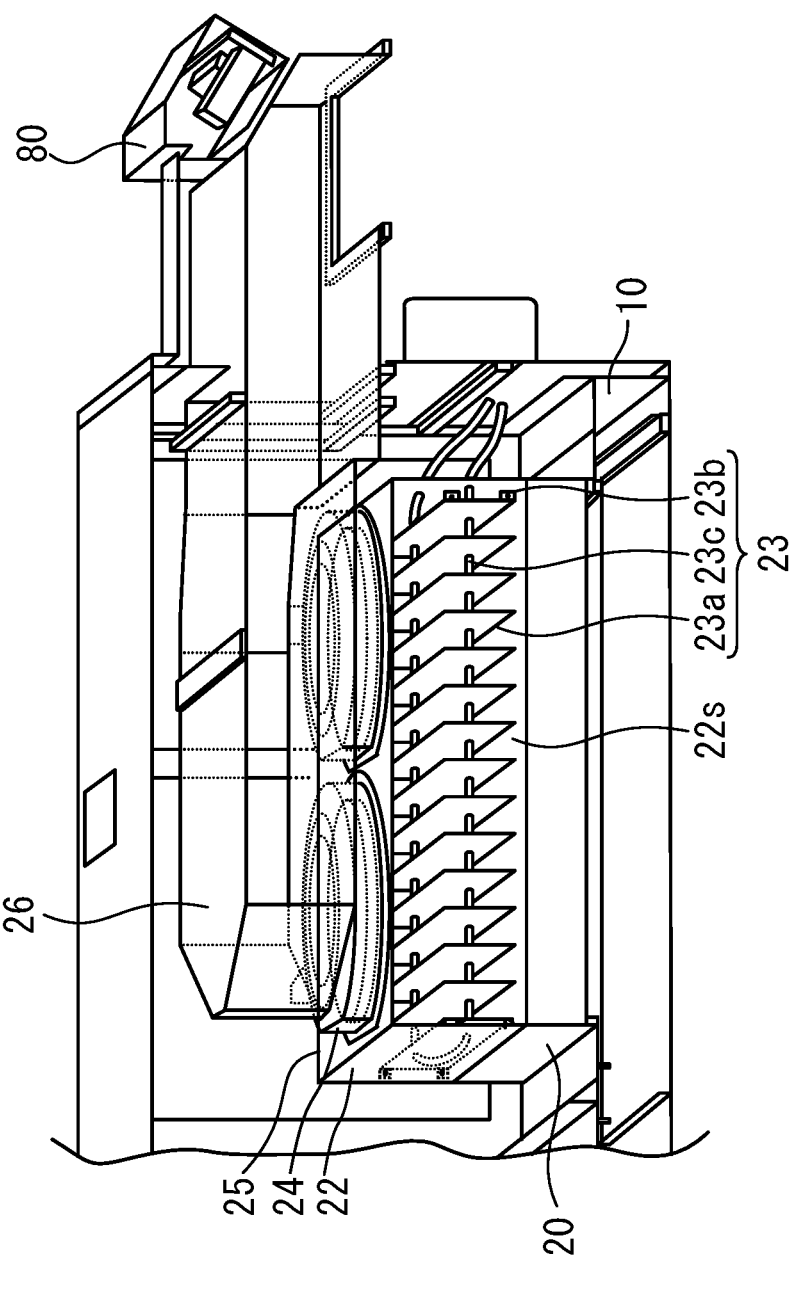
FIG. 2 is a perspective view of a fan filter unit and a radiator.

FIG. 2 is a perspective view of each fan filter unit. For the purpose of description, the inside of the FFU housing 22 is illustrated as well. FIG. 2 illustrates the radiator 23 provided between the fan 24 and the filter 20. In an example, the radiator 23 includes a fin 23a, a fixing part 23b, and a tube 23c. The fixing part 23b is a part connected to the fin 23a. The radiator 23 is fixed to the FFU housing 22, for example, when the fixing part 23b is screwed to an inner wall of the FFU housing 22. In an example, no size change due to provision of the radiator 23 in the fan-filter space 22s occurs to the FFU housing 22. Specifically, the radiator 23 is provided in a vacant space of the fan-filter space 22s to avoid size increase of the FFU 25.

The tube 23c is connected to a plurality of fins 23a. The tube 23c and the plurality of fins 23a are cooled as coolant flows in the tube 23c. Gas discharged from the fan 24 reaches the filter 20 after being cooled by the plurality of cooled fins 23a. In another example, a radiator of another type may be employed as the radiator 23. The radiator 23 may be a radiator of a plate fin type, a radiator of a corrugate fin, or a radiator of any other type.

Description continues with reference to FIG. 1. A space adjacent to the filter 20 described above is surrounded by the housing 10. In an example, the housing 10 includes a support plate that supports the FFU 25. Gas having passed through the filter 20 is provided into the housing 10 through a plurality of holes provided at the support plate.

A space adjacent to the fan 24 is surrounded by an upper housing 26. In an example, the upper housing 26 is provided above the FFU 25. Gas provided to the upper housing 26 is introduced into the fan-filter space 22s by rotation of the fan 24 and filtered through the filter 20. When the fan 24 is rotating, the internal pressure of the upper housing 26 is lower than the pressure of the fan-filter space 22s. When the fan 24 is not rotating, the internal pressure of the upper housing 26 is substantially equal to the pressure of the fan-filter space 22s.

In an example, the upper housing 26 and the housing 10 are connected to each other through a circulation duct 30. Part of the circulation duct 30 is provided inside the housing 10. The part of the circulation duct 30 inside the housing 10 is referred to as an in-housing duct 30a. The in-housing duct 30a has a hole. In an example, the in-housing duct 30a has an opening directly below the FFU 25. The circulation duct 30 communicates with the space of the side chamber 14 at an intermediate part. In the example illustrated in FIG. 1, an opening is provided at a side surface of the side chamber 14, and the intermediate part of the circulation duct 30 communicates with the space of the side chamber 14 through the opening.

As the fan 24 of the FFU 25 rotates, a gas in the upper housing 26 is emitted into the interior of the housing 10. According to one example, a gas is provided to the upper housing 26 from a nitrogen gas source 40 or a CDA source 50.

The nitrogen gas source 40 and the upper housing 26 are connected by a nitrogen gas supply pipe 48. A solenoid valve (SV) 42 is attached to the nitrogen gas supply pipe 48. The SV 42 opens and closes the nitrogen gas supply pipe 48 according to instructions. A limit switch 44 is attached to the SV 42 to monitor the operation of the SV 42. Specifically, the limit switch 44 detects a discrepancy between an input signal to the SV 42 and an actual position of a valve of the SV 42, based on a function of detecting the input signal and the actual position. In another example, the SV 42 and the limit switch 44 may be replaced by other configurations.

The CDA source 50 and the upper housing 26 is connected by a CDA supply pipe 51. A valve 54 and a flow meter 52 are attached to the CDA supply pipe 51. The valve 54 is provided for opening and closing the CDA supply pipe 51. The flow meter 52 is provided for detecting an amount of the CDA flowing through the CDA supply pipe 51.

A part of the nitrogen gas supply pipe 48 close to the nitrogen gas source 40 and a part of the CDA supply pipe 51 close to the CDA source 50 are separate pipes. However, in one example, a part of the nitrogen gas supply pipe 48 close to the upper housing 26 and a part of the CDA supply pipe 51 close to the upper housing 26 has a common tube. According to an example, a mass flow controller (MFC) 46 is attached to the common tube to adjust a flow rate of a gas.

These components function as a gas supply system attached to the upper housing 26. The gas supply system is not limited to that described above. For example, a system that provides optional inert gas may be used as the gas supply system.

A discharge pipe 60 is attached to the housing 10. According to one example, a pressure control valve 62 is configured to regulate the flow rate of an exhaust gas flowing through the discharge pipe 60. An exhaust pressure sensor 64 is attached to the discharge pipe 60 to measure a pressure in the discharge pipe 60. According to an example, the exhaust pressure sensor 64 is a differential pressure gauge for measuring a differential pressure between an internal pressure and an external pressure of the discharge pipe 60.

These components function as a discharge system attached to the housing 10. In another example, various systems that achieve an optional discharge flow amount may be used as the discharge system.

Figure 3:
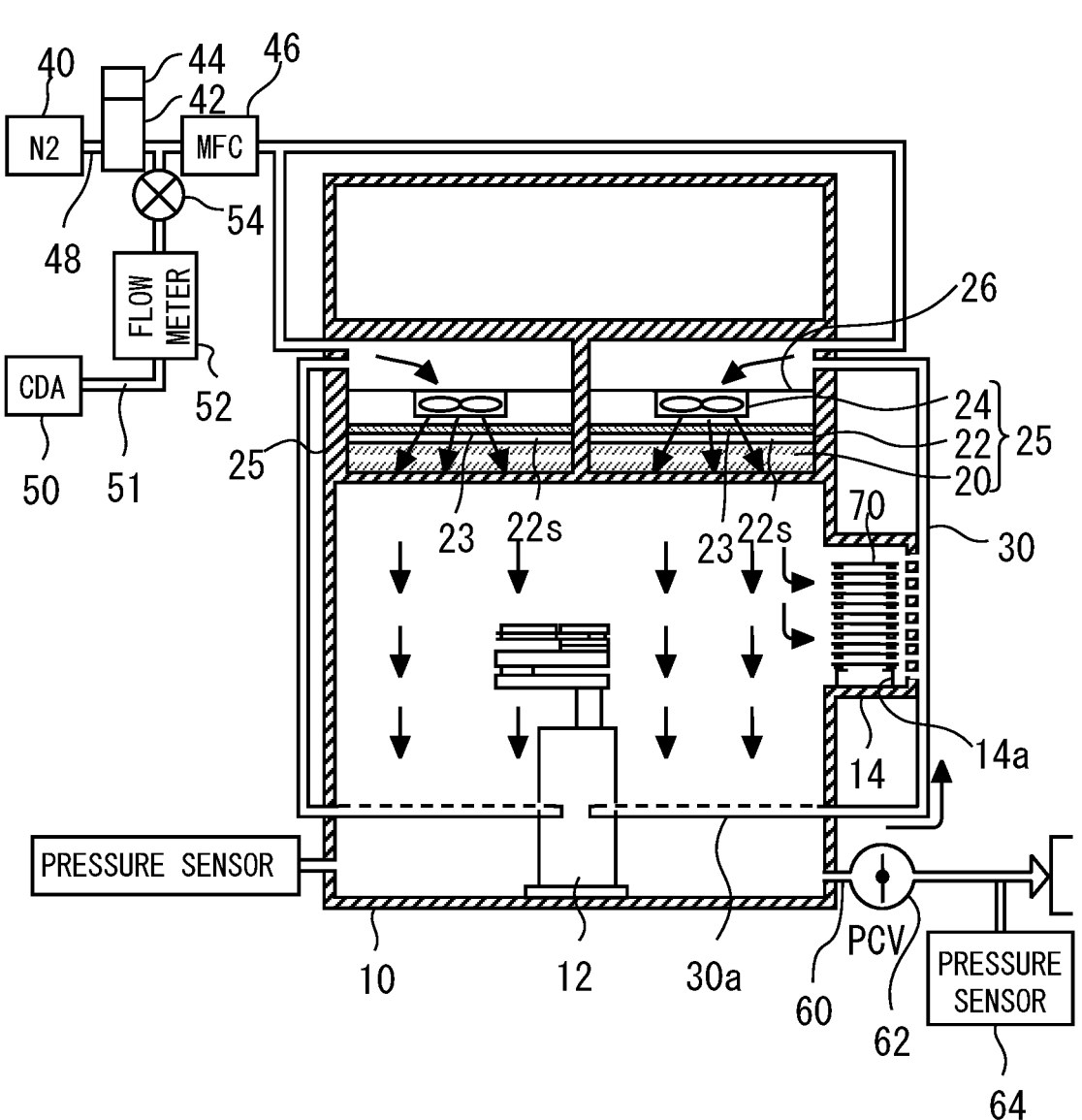
FIG. 3 is a diagram illustrating exemplary gas flow in the interface module.

FIG. 3 is a diagram illustrating exemplary gas flow in the interface module. First, $N_2$ gas or CDA is provided to the upper housing 26 by the gas supply system. The gas in the upper housing 26 is introduced into the fan-filter space 22s by rotation of the fan 24. Then, the gas in the fan-filter space 22s is cooled by the radiator 23 and provided into the housing 10 through the filter 20. Since a pressure loss occurs at the filter 20, the pressure of the fan-filter space 22s is higher than the pressure in the housing 10 and the pressure in the upper housing 26. In other words, the gas stays in the fan-filter space 22s for a relatively long time. Accordingly, the gas is sufficiently cooled by the radiator 23.

Gas provided into the housing 10 through the filter 20 proceeds to any of three paths below.

Path 1: The gas enters the circulation duct 30 from the intermediate part of the circulation duct 30 through the side chamber 14 and returns to the upper housing 26.

Path 2: The gas enters the circulation duct 30 from the in-housing duct 30a and returns to the upper housing 26.

Path 3: The gas is discharged through the discharge pipe 60.

Gas proceeding to Path 1 or 2 is provided to a space below the filter 20 through the FFU 25 again. Thus, the interface module partially circulates gas. The partial circulation is mainly performed for cost reduction of gas. The temperature of gas in the interface module increases in some cases when a substrate at high temperature is conveyed by the robotic arm 12 or a substrate 70 at high temperature is cooled at the substrate support instrument 14a. However, with the configuration illustrated in FIGS. 1 to 3, gas can be cooled for a long time since the radiator 23 is installed between the fan 24 and the filter 20. Accordingly, increase of gas temperature in the interface module can be reduced.

Figure 4:
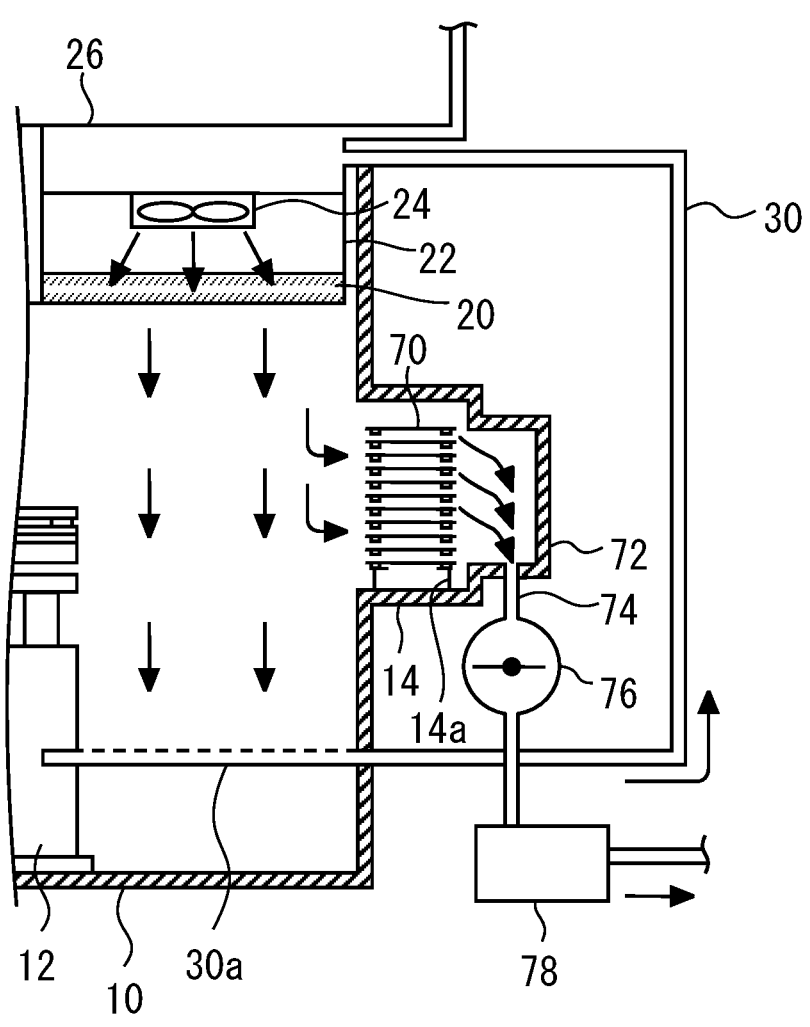
FIG. 4 is a diagram illustrating an exemplary configuration of an interface module according to another example.

FIG. 4 is a diagram illustrating an exemplary configuration of an interface module according to another example. A discharge housing 72 that provides a space communicating with the inside of the housing 10 is provided beside the substrate support instrument 14a. The discharge housing 72 provides, beside the housing 10, the space communicating with the housing 10. In an example, the discharge housing 72 is provided beside every substrate support part of the substrate support instrument 14a. In other words, the space of the discharge housing 72 is provided beside every substrate support part.

In the example illustrated in FIG. 4, the discharge housing 72 is adjacent to the side chamber 14. In the example illustrated in FIG. 4, the longitudinal length of the side chamber 14 is longer than the longitudinal length of the discharge housing 72. The upper end of the discharge housing 72 is lower than the upper end of the side chamber 14, and the lower end of the discharge housing 72 is higher than the lower end of the side chamber 14. In another example, the longitudinal length of the side chamber 14 may be equal to the longitudinal length of the discharge housing 72, or the longitudinal length of the side chamber 14 may be shorter than the longitudinal length of the discharge housing 72.

A discharge system is attached to the discharge housing 72. In an example, the discharge system includes a discharge pipe 74, a pressure control valve 76, and a vacuum pump 78. In another example, the discharge system may have another configuration. In the example illustrated in FIG. 4, the discharge system is connected to the lower surface of the discharge housing 72.

In the example illustrated in FIG. 4, gas provided into the housing 10 through the filter 20 proceeds to any of two paths below.

Path 1a: The gas is discharged from the discharge pipe 74 through the side chamber 14 and the discharge housing 72 in the stated order.

Path 2a: The gas enters the circulation duct 30 from the in-housing duct 30*a* and returns to the upper housing 26.

In the example illustrated in FIG. 4, gas heated by a substrate in the side chamber 14 is discharged through the discharge housing 72 and the discharge system without circulation. In an example, the discharge housing 72 is provided beside every substrate support part of the substrate support instrument 14*a* to achieve discharge from the lower surface side of the discharge housing 72 so that the whole or substantially whole gas heated in the side chamber 14 can be efficiently discharged. In other words, uniform discharge can be performed. Accordingly, the temperature of gas in the interface module is maintained temporally substantially constant. In an example, no radiator may be provided in the interface module illustrated in FIG. 4.

Figure 5:
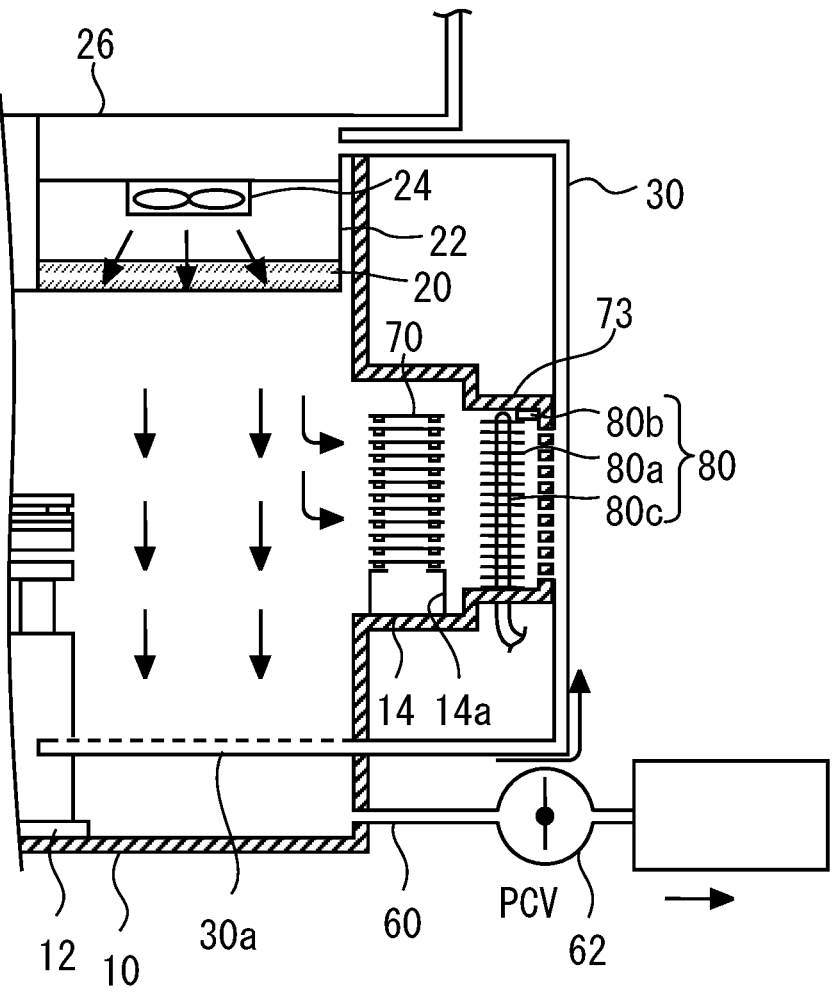
FIG. 5 is a diagram illustrating an exemplary configuration of an interface module according to another example.

FIG. 5 is a diagram illustrating an exemplary configuration of an interface module according to another example. A cooling room 73 is provided beside the substrate support instrument. The cooling room 73 provides a space connecting to the housing 10. In the example illustrated in FIG. 5, the cooling room 73 is provided beside the side chamber 14. In this example, a space below the FFU 25 communicates with the space of the cooling room 73 through the space of the side chamber 14. A radiator 80 is provided in the cooling room 73. The radiator 80 may employ various configurations for cooling gas. In the example illustrated in FIG. 5, the radiator 80 includes a fin 80*a*, a fixing part 80*b*, and a tube 80*c*. The radiator 80 is fixed to the cooling room 73 by the fixing part 80*b*. The tube 80*c* and a plurality of fins 80*a* connected to the tube 80*c* are cooled as a refrigerant flows in the tube 80*c*.

The intermediate part of the circulation duct 30 communicates with the space of the cooling room 73. In the example illustrated in FIG. 5, the intermediate part of the circulation duct 30 communicates with the cooling room 73 through an opening provided at a side surface of the cooling room 73. In an example, the cooling room 73 is provided beside every substrate support part of the substrate support instrument 14*a*.

Gas provided into the housing 10 through the filter 20 proceeds to any of three paths below.

Path 1b: The gas enters the circulation duct 30 from the intermediate part of the circulation duct 30 through the side chamber 14 and the cooling room 73 in the stated order and returns to the upper housing 26.

Path 2b: The gas enters the circulation duct 30 from the in-housing duct 30*a* and returns to the upper housing 26.

Path 3b: The gas is discharged from the discharge pipe 60.

Gas proceeding to Path 1b or 2b is provided to the space below the filter 20 through the FFU 25 again. The temperature of gas in the side chamber 14 increases when the substrate 70 at high temperature is cooled at the substrate support instrument 14*a*. However, with the configuration illustrated in FIG. 5, gas heated by the substrate 70 proceeds from the side chamber 14 to the cooling room 73 and is cooled in the cooling room 73 and then provided to the circulation duct 30. Accordingly, increase of gas temperature in the interface module can be reduced.

The temperature of gas in the side chamber 14 is higher than the temperature of gas entering the in-housing duct 30*a*. Thus, it is possible to efficiently cool the gasses by cooling only the gas from the side chamber 14 before the gasses merge in the circulation duct 30. Furthermore, gas flow speed becomes high when the gas from the side chamber 14 and the gas entering the in-housing duct 30*a* enter the circulation duct 30, and thus it is difficult to cool the gasses in the circulation duct 30. However, with the configuration illustrated in FIG. 5, gas having a temperature increased in the side chamber 14 and a low flow speed before merging can be sufficiently cooled in the cooling room 73.

Figure 6:
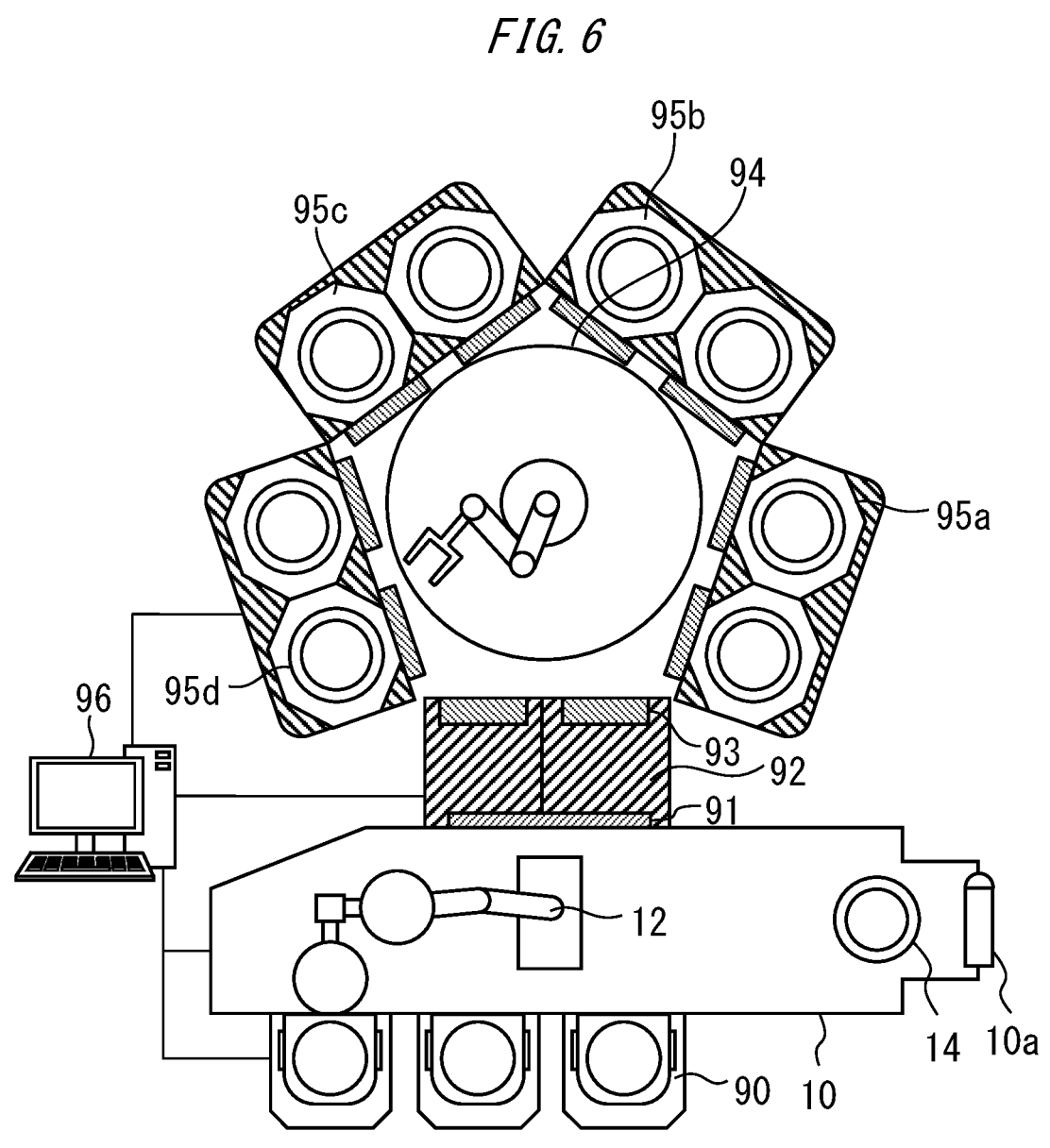

FIG. 6 is a diagram illustrating an exemplary configuration of a semiconductor manufacturing device including an interface module. Each above-described interface module can be employed as the housing 10 and its peripheral instruments. A door 10*a* through which a person enters and leaves is attached to the housing 10. The door 10*a* is called an EFEM door. In an example, the door 10*a* can be opened and closed by an electrical magnetic lock switch. A switch for stopping a robot and the like when the door 10*a* is opened is sometimes provided inside the interface module. The switch is a switch having a low heat resistance, such as an electrical magnetic lock switch, in some cases. The heat resistance of the electrical magnetic lock switch is typically 50° C. approximately at the highest. Thus, the temperature of the electrical magnetic lock switch potentially exceeds its heat-resistant temperature, for example, when a substrate at 200° C. or higher is handled in the housing 10. However, when any above-described interface module is employed, it is possible to reduce increase of gas temperature in the interface module, thereby reducing damage on a component having a low heat resistance.

With each above-described configuration, it is possible to prevent or reduce increase of gas temperature in an interface module. Thus, it is possible to maintain substrate cooling capacity.

At least one load port 90 is provided next to the housing 10. Further, a Load Lock Module (LLM) 92 is adjacent to the housing 10 via a gate valve 91. A Wafer Handling Chamber (WHC) 94 is adjoined to the LLM 92 via gate valves 93. The WHC 94 is connected to four chamber modules 95*a*, 95*b*, 95*c*, 95*d* that are used to process substrates. In this example, the interface module serves as an interface for transporting the substrate from one of the LLM92 and the load port 90 to the other. According to one example, the semiconductor manufacturing apparatus including the interface module is controlled by a controller 96.

The invention claimed is:

1. An interface module comprising:
a fan filter unit including a fan and a filter;
a housing surrounding a space adjacent to the filter;
a discharge pipe attached to the housing;
a substrate support instrument provided in the housing;
an upper housing surrounding a space adjacent to the fan;
a gas source or clean dry air (CDA) source attached to the upper housing by a supply pipe;
a robotic arm provided in the housing;
a circulation duct connected to the housing and the upper housing; and
a radiator provided between the fan and the filter,
wherein the housing includes a side chamber between a part of the housing in which the robotic arm is stored and the circulation duct.

2. The interface module according to claim 1, wherein the fan filter unit includes a fan filter unit (FFU) housing in which the fan, the filter, and the radiator are stored.

3. The interface module according to claim 2, wherein the radiator is screwed to an inner wall of the FFU housing.

4. The interface module according to claim 1, wherein the radiator includes a tube through which coolant flows and a fin.

5. The interface module according to claim 1, wherein the substrate support instrument is provided in the side chamber.

6. The interface module according to claim 5, wherein the circulation duct communicates with a space of the side chamber at an intermediate part.

7. The interface module according to claim 6, wherein the circulation duct includes an in-housing duct in the housing, and the in-housing duct has an opening directly below the fan filter unit.

8. An interface module comprising:

a fan filter unit including a fan and a filter;

a housing surrounding a space adjacent to the filter;

a substrate support instrument provided in the housing;

an upper housing surrounding a space adjacent to the fan;

a gas source or clean dry air (CDA) source attached to the upper housing by a supply pipe;

a circulation duct connected to the housing and the upper housing;

a robotic arm provided in the housing;

a discharge housing that provides a space beside the substrate support instrument, the space communicating with inside of the housing; and a discharge pipe attached to the discharge housing, wherein the housing includes a side chamber provided between a part of the housing in which the robotic arm is stored and the discharge housing.

9. The interface module according to claim 8, wherein the discharge pipe is connected to a lower surface of the discharge housing.

10. The interface module according to claim 8, wherein a longitudinal length of the side chamber is longer than a longitudinal length of the discharge housing.

11. The interface module according to claim 8, wherein the substrate support instrument is provided in the side chamber.

12. The interface module according to claim 8, wherein the discharge housing is provided beside every substrate support part of the substrate support instrument.

8

13. An interface module comprising:

a fan filter unit including a fan and a filter;

a housing surrounding a space adjacent to the filter;

a discharge pipe attached to the housing;

a substrate support instrument provided in the housing;

an upper housing surrounding a space adjacent to the fan;

a gas source or clean dry air (CDA) source attached to the upper housing by a supply pipe;

a circulation duct connected to the housing and the upper housing;

a cooling room that is provided between the substrate support instrument and an intermediate part of the circulation duct, and provides a space connecting to the housing; and a radiator provided in the cooling room, wherein the intermediate part of the circulation duct communicates with the space of the cooling room through an opening provided at a side surface of the cooling room.

14. The interface module according to claim 13, further comprising a robotic arm provided in the housing.

15. The interface module according to claim 14, wherein the housing includes a side chamber provided between a part of the housing in which the robotic arm is stored and the cooling room, the substrate support instrument is provided in the side chamber.

16. The interface module according to claim 13, wherein the cooling room is provided between every substrate support part of the substrate support instrument and the circulation duct.

17. The interface module according to claim 13, wherein the radiator is fixed to the cooling room.

18. The interface module according to claim 13, wherein the radiator includes a tube through which coolant flows and a fin.

* * * * *